April 18, 1967

HEINZ-HERBERT ARNDT ET AL

PROCESS OF OPEN-TYPE DIFFUSION IN SEMICONDUCTOR BY GASEOUS PHASE 3,314,833

Filed Sept. 28, 1964

2 Sheets-Sheet 1

United States Patent Office 3,314,833
Patented Apr. 18, 1967

3,314,833

PROCESS OF OPEN-TYPE DIFFUSION IN SEMICONDUCTOR BY GASEOUS PHASE

Heinz-Herbert Arndt, Nurnberg, Jürgen Schädel, Hochstadt (Aisch), and Hans Uebel, Nurnberg, Germany, assignors to Siemens-Schuckertwerke Aktiengesellschaft, Berlin-Siemensstadt, and Erlangen, Germany Filed Sept. 28, 1964, Ser. No. 399,731
Claims priority, application Germany, Sept. 28, 1963, S 87,592
3 Claims. (Cl. 148—189)

Our invention relates to methods and means for doping semiconductor bodies by diffusing impurity atoms into the bodies.

In the manufacture of electronic semiconductor members use is often made of the phenomenon that different substances, under certain conditions, will diffuse into each other. The diffusion process, as a rule, is performed by diffusing a quantity of beneficial impurity atoms from the gaseous phase into a surface region of a solid semiconductor body. By reliably and reproducibly adjusting the doping impurity concentration thus produced in the surface region, various other significant parameters can be given a predetermined value, such as a given depth of penetration and a desired specific electric resistance of the doped region.

Among the known diffusion processes thus employed are the ampoule method and the carrier-gas method. The ampoule method is a closed diffusion process operating without a flowing transporting medium for the doping substance. With this method, the semiconductor specimen is located in a sealed ampoule and is spaced only a few millimeters apart from a quantity of doping substance which constitutes the dopant source. The dopant concentration in the surface region of the semiconductor specimen can be varied and controlled by selecting the composition of the dopant substance and the gaseous atmosphere of the closed system. Suitable doping substances for this method are boron oxide ($B_2O_3$) and phosphorus oxide ($P_2O_5$), for example. The ampoule method, preformed with an invariable source, affords a good reproducibility of the margin or surface concentration of the diffused dopant atoms in the semiconductor body. The temperature need not be maintained within very precise limits. This method, however, has the disadvantages of being excessively time consuming, expensive and intricate, aside from the fact that the handling of the ampoule is troublesome in most cases.

The carrier-gas method is an open diffusion process operating with a flowing transporting medium for the doping substance. The flow of medium transports the doping substance from a source to the semiconductor specimen. The margin or surface concentration of the dopant atoms in the specimens can be controlled by the quantity of the dopant substance impinging upon the semiconductor per unit time, also by varying the temperature of the semiconductor specimen, and by selecting the composition of the transporting gas. The carrier-gas method affords a convenient manipulation but has the disadvantage of requiring various parameters to be maintained with high precision. This applies to the temperature of the dopant source, the temperature of the semiconductor specimens, the gas composition, and to the flow rate of the carrier gas. Turbulence of the flowing gas may also cause difficulties.

It is an object of our invention to provide a method for the diffusion doping of semiconductor bodies which substantially combines the advantages of the above-mentioned ampoule method and carrier-gas method while avoiding the disadvantages of both.

More specifically, it is an object of the invention to provide a method for the diffusion doping of semiconductor bodies which permits operating by an open diffusion process but without a continuous flow of carrier gas, thus affording a reliable control of the dopant quantity or concentration at the semiconductor surface region, which can be carried out in a simple and reliably reproducible manner, akin in this respect to the above-mentioned ampoule method, but which is more convenient and more expeditious in its performance and less critical with respect to precise maintenance of processing parameters than the above-mentioned known carrier-gas method.

According to our invention, the semiconductor specimens to be diffusion doped are placed in close proximity to a homogeneous layer which contains a defined content of doping substance, this layer constituting the source of doping material; and the specimens together with the source layer are then heated in an open diffusion process to vaporize the homogeneous layer of a given dopant quantity from the source layer onto the semiconductor specimens.

According to a more specific feature of the invention, the source employed is constituted by an inner surface layer of a unilaterally open tube, the layer being formed of a homogeneous composition of doping substance and tube material. The diameter of the tube is only slightly larger than the width of the semiconductor specimens; and preferably the length of the tube is not appreciably larger than the uniform-temperature zone in the furnace being used for heating the tube and its contents. The inner cross section of the above-mentioned tube may be circular but is not necessarily limited to circular shape.

According to another feature, a planar plate is used instead of the tube, the plate being provided with a homogeneous layer of substance suitable for doping the semiconductor specimens. When using a plate whose dimensions are large in comparison with those of the semiconductor specimens, a decline in dopant concentration, as may occur in the vicinity of a tube opening, is avoided.

When employing a tube as described above, the semiconductor specimens, usually in the shape of flat discs or plates, are inserted into the tube in horizontal position or in an inclined position, for example at an angle of 45° toward the horizontal; and only the half-portion of the tube adjacent to the sealed end is used for the diffusion process in order to avoid non-uniformities due to the above-mentioned decrease of dopant concentration near the opening of the tube.

The open diffusion process is performed in an indifferent atmosphere, for example nitrogen, helium or argon, but may also be performed in a reducing atmosphere, for example in hydrogen, or in an oxidizing atmosphere. When performing the diffusion process with semiconductor specimens of silicon, the use of an oxidizing atmosphere has been found to result in particularly smooth diffusion fronts. The doping substance is then built into the growing oxide coating of the semiconductor body as the body becomes simultaneously oxidized at the surface; and, if the carrier substance of the source consists of the same material as the semiconductor surface, the dopant concentration in the semiconductor surface cannot exceed the concentration of the source due to the occurring thermodynamic vapor-pressure equilibrium. Since air, for example, is suitable as oxidizing atmosphere, the method is most readily and conveniently applicable in this manner.

A further advantage of the method according to the invention is the fact that the temperature need not be maintained with great precision. This is because the upper limit of the surface concentration with respect to the dopant atoms on the semiconductor bodies is predetermined by the thermodynamic vapor-pressure equilibrium between the source and the semiconductor material. In addition, this dopant concentration at the semiconductor surface can be controlled or adjusted by the composition of the dopant source. The open diffusion process according to the invention thus secures a good and reliable reproducibility of the dopant concentration on the semiconductor bodies.

Another and particularly advantageous way of performing the method of the invention resides in the simultaneous use of two different plate-shaped sources for the purpose of double diffusion. In this manner, the two sides of the semiconductor specimens can be treated simultaneously to receive respectively different dopant concentrations and/or respectively different doping atoms.

The method of the invention requires using a doping source which permits a proper selection of control of the above-mentioned dopant concentration at the surface region of the semiconductor and which is also extremely homogeneous. This is because, due to the slight distance of the source from the semiconductor specimens, any fluctuations in concentration of the source would be almost fully manifested by corresponding fluctuations in dopant concentration at the specimens. According to a further feature of our invention, a source satisfying these requirements is readily produced by modifying the known ampoule method as follows. Placed into a hermetically sealable tube of high-melting material, particularly quartz or quartz glass, is a primary source consisting of the same material as the tube but containing a given content of doping substance. After sealing the tube, the tube and the primary tube contained therein, are heated to vaporize the dopant from the source material. The vaporization is effected at highest feasible temperature, for example 1200° C., which is kept uniform over the entire length of the ampoule and is continued for a prolonged period of time, for example several days. The doping substance thus vaporized upon the inner wall of the tube diffuses into the wall. Thereafter the ampoule is opened at one end and is ready to receive semiconductor specimens and to serve as a dopant source in the method already described.

In the same manner, a planar plate, particularly a plate of quartz glass, can be provided with a vapor-deposited and diffused layer inside such a completely sealed ampoule. After the preparatory process is terminated, the ampoule is opened, and the plate with its layer of dopant source material is then available for performing the above-described semiconductor fabricating method proper.

In both cases, namely when using a tubular source or a planar source, the concentration of the doping substance in the layer on the inner surface of the tube or on the planar surface of the plate, is controllable by a corresponding choice of the primary source composition. In this manner, a very homogeneous layer is formed on the inner surface of the tube or on the planar surface of the plate. That is, due to the occurring thermodynamic vapor-pressure equilibrium attainable inbetween the primary source and the resulting layer formed of tube or plate material and doping substance, this layer possesses the same composition as the substance of the primary source. This layer of doping substance and the carrier material constitutes the source proper for use in subsequent treatment of the semiconductor specimens.

Sources produced by the above-described preparatory method exhibit an excellent constancy of their properties together with a very long time of useful life. Depending upon the frequency of use, they can be employed up to one year or longer.

It will be understood from the foregoing that the dopant source in the semiconductor fabricating method according to the invention is generally constituted by a surface layer or surface region of a carrier substance into which the doping substance proper is diffused. At the high processing temperature, the source, often having a layer thickness of but a few tenths of one millimeter, may be liquid. The carrier substance of the source is constituted by the wall material of the above-mentioned tube or the material of the plate. If it is desired that in the manufacture of the source a thermodynamic vapor-pressure equilibrium will occur between the primary source and the secondary source being produced, it is advisable to mix the doping substance contained in the primary source with a material identical with the carrier substance of the source. In this manner, a desired concentration of the doping substance at the surface of the secondary source can be predetermined by the composition of the primary source. Such a primary source can be placed into the original ampoule in the form of a finely pulverized mixture of the component substances or also in the form of a sintered body. The heat treatment employed in the preparation of the source then results at a sufficiently high temperature in the formation of a homogeneous and usually vitreous primary source which can thereafter be used as often as desired for forming a diffused layer or region of a new secondary source.

Suitable as carrier material is any material, for example $SiO_2$, which in the open diffusion method of the invention, possesses a lower vapor pressure than the doping substance being used, or at most the same vapor pressure; which, secondly, does not by itself have a doping effect detrimental to the semiconductor specimens, and thirdly which is capable of forming in the above-mentioned surface layer or region and together with the doping substance a homogeneous and compositionally controllable compound, alloy or other uniform phase, for example a glass or vitreous substance.

Suitable as doping substance for the purposes of the invention is any dopant which, like boron or phosphorus for example, by itself or in form of its non-detrimentally doping chemical compounds, such as $B_2O_3$ or $P_2O_5$, has a higher or at least the same vapor pressure as the carrier material of the source and which, on the other hand, forms together with the carrier substance a homogeneous and compositionally controllable compound, alloy or other uniform and homogeneous phase, particularly a glass or vitreous material.

According to the invention, the open diffusion method described in the foregoing is applicable in the planar technique, particularly silicon planar technique, in the production of drift transistors, semiconductor controlled rectifiers or thyristors with turn-off characteristic, and generally for the production of regions having respectively different types of conductance in semiconductors, particularly in cases where two or more diffusion regions are to be located above each other.

Preferably applied in the open diffusion method of the invention are vaporization temperatures of 700 to 1000° C. if the doping substances are available as oxides, for example $B_2O_3$ or $P_2O_5$. In such cases, the source, preferably is a vitreous composition of $SiO_2$ and $B_2O_3$ or $P_2O_5$.

For further explaining the invention, reference will be made to examples and embodiments desrcibed hereinafter in conjunction with the accompanying drawings in which.

Figure 1:
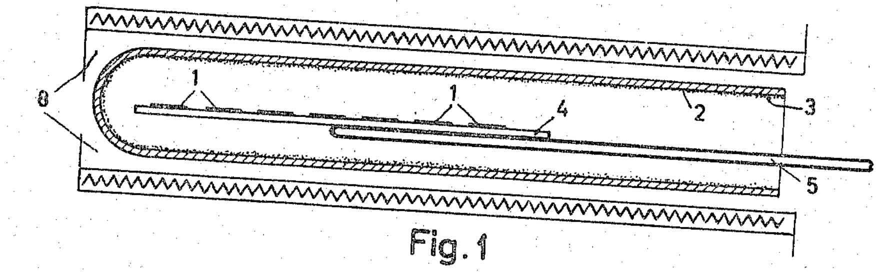
FIG. 1 shows schemtically a processing device according to the invention during treatment of semiconductor specimens within a tubular source.

In FIG. 1 there is shown a unilaterally open tubular source 3 consisting of a tubular carrier structure of quartz glass whose inner surface is provided with a diffused layer 2 consisting of doping substance and carrier material (quartz glass) and having homogeneous dopant distribution and concentration. The semiconductor specimens 1 consist of flat circular plates, for example of silicon, germanium or other semiconductor material. The semiconductor specimens are placed flat upon a holder 4 located in the half-portion of the tubular source near the closed end. The tube 3 is placed into an electric tubular furnace 8. The temperature in the tubular source 3 is measured by means of a thermo-couple 5.

Figure 2:
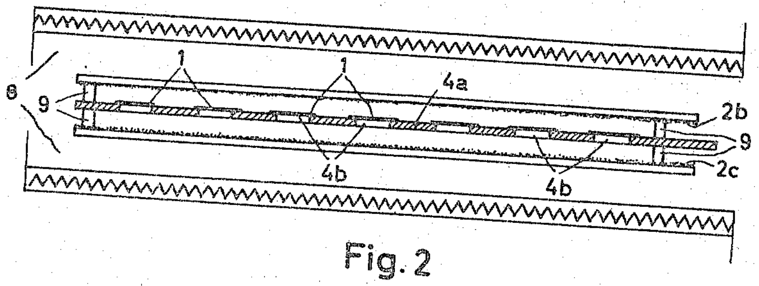
FIG. 2 shows schematically a device according to the invention involving the use of two plate-shaped sources for diffusion doping of semiconductor discs on both sides.

According to FIG. 2, the semiconductor specimens, also consisting of flat plates or discs, are placed upon a perforated holder plate 4a and cover the respective openings 4b of the plate. The holder is mounted between two sources 2b and 2c, each consisting of a flat plate of quartz glass having a diffused surface layer formed of the carrier (plate) material and doping substance as described in the foregoing. The openings 4b are almost as large as the respective semiconductor discs 1. Spacers 9 keep the plate-shaped sources 2b and 2c at a slight and fixed distance from the semiconductor discs. The two sources 2b and 2c may be coated with different doping substance having respectively different concentration. As a result, a double diffusion on the respective two flat sides of each semiconductor specimen is afforded in a single heating operation.

If relatively large diffusion depths are to be obtained, for example a depth of more than 1 to 2 microns, it is preferable to only perform the above-described method of the invention in the active range of the source for the main purpose of vapor depositing upon the specimens the required amount of doping substance, and to thereafter continue or perform the diffusion of the doping substance into the semiconductor specimens by again heating the specimens in a different space and at a higher temperature in the absence of the above-described source or sources.

Figure 3:
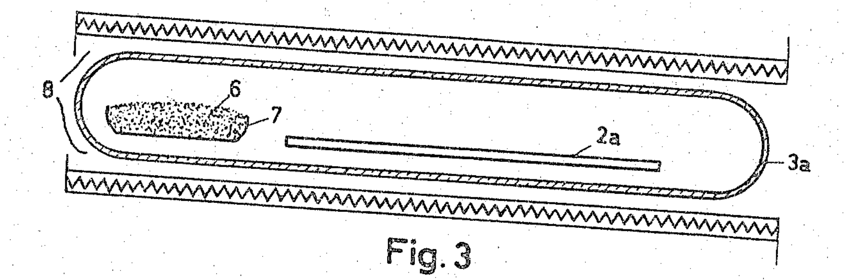
FIG. 3 shows schematically a device for producing the tubular and the plate-shaped sources accordings to FIGS. 1 and 2.

The above-described production of the tubular and plate-shaped sources is schematically shown in FIG. 3. When the active layer in the tubular source 3a is being produced, the tube is evacuated and preferably fused off, asuming that the tube is an ampoule of quartz or quartz glass. Located in the ampoule is the primary source 6 constituted by a boat 7 of platinum which contains a quantity of purverulent doping substance. The plate-shaped source 2a can be produced by the same method and in the same operating step, simply by also accommodating it within the quartz amopule as shown.

Figure 4:
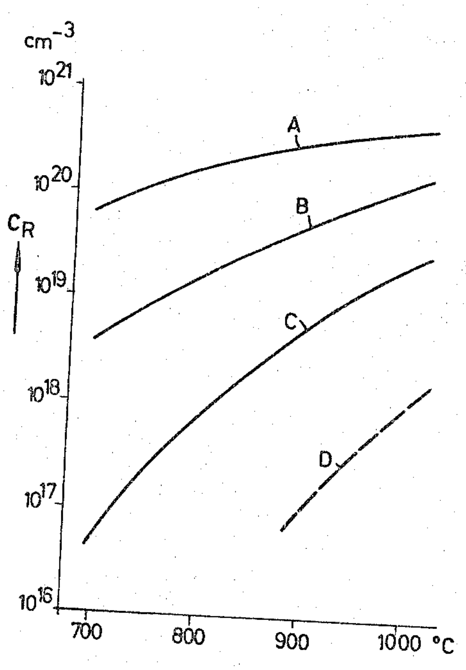
FIG. 4 is an explanatory graph relating to the dopant concentration at the surface of silicon specimens.

In the diagram of FIG. 4, the dopant concentration $C_R$ at the edge of silicon specimens is indicated on the ordinate as a function of the vaporization temperature indicated on the abscissa. The results are indicated by curves A to D corresponding to respectively different parameters. Each curve was taken after 30 minutes vaporization and one hour subsequent diffusion at 1200° C. The curves A to C were ascertained by employing primary sources having respectively different contents of $B_2O_3$. Curve A corresponds to a primary source of 50% $B_2O_3$, curve B to a primary source of 40% $B_2O_3$, and curve C to a primary source of 30% $B_2O_3$ (all percentages being by weight). The curve D resulted by using a primary source containing 35% $P_2O_5$.

Figure 5:
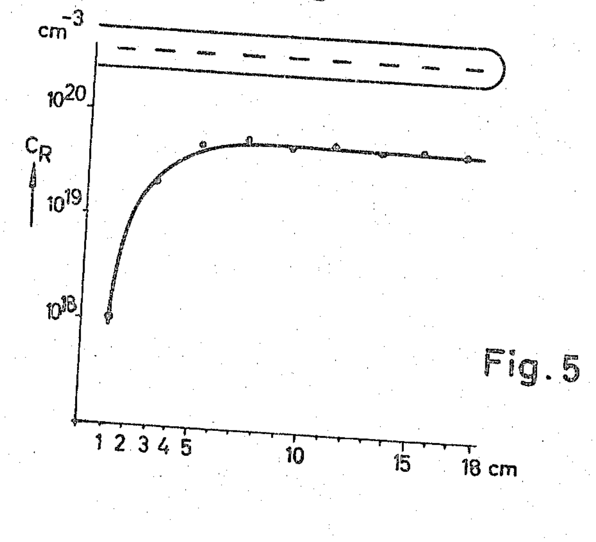
FIG. 5 is an explanatory graph showing the surface concentration of dopant in specimens versus their distance from the open end of a tubular source.

In FIG. 5 the abscissa denotes the distance (in cm.) from the open end of the tubular source shown at the top of the same diagram, and the ordinate indicates the marginal dopant concentration $C_R$ in $cm.^{-3}$). The curve was obtained by measurements made each time after 30 minutes of vaporization at 900° C. ±3° C. and one hour of subsequent diffusion at 1200° C.

It will be recognized that the marginal concentration $C_R$ of the dopant atoms in the surface region of the semiconductor disc was uniform for all specimens located in the half-portion of the tube near the closed end of the tubular source, and also somewhat beyond this half-portion. This explains why it is preferable to locate the specimens in the half-portion adjacent to the closed end, thus securing uniform diffusion results for all of the specimens treated simultaneously.

When applying the method of the invention for the diffusion doping of semiconductors from the fourth group of the periodic system, such as Si and Ge, the conventional doping substances are from the third and fifth group of the periodic system of elements. However, the method is likewise applicable to other substances used in semiconductor techniques for the purpose of diffusing beneficial impurities into semiconductor bodies. For example, gold is thus applicable as a doping substance. The carrier substances of the sources and the doping substances are not limited to chemical compounds of elements such as oxides. The carrier substance, for example, may also consist of a metal which does not have a detrimental doping effect upon the semiconductor specimens, this being the case for example with platinum, silicon, germanium and others. The doping substance evaporating from a primary source in the above-described manner may be caused to diffuse into the surface of any of these other carrier substances. In such cases, the primary source is preferably composed of the doping substance and a material identical with the carrier substance of the secondary source. The doping substance may also consist of an elemental substance suitable for semiconductor techniques.

If in the production of silicon or germanium semiconductors, the carrier substance of the source consists of elemental silicon or germanium (in the shape of a tube or plate), then the thermodynamic vapor-pressure equilibrium relative to the doping substance will also occur between the source and the semiconductors which are to receive the vapor-deposited layer. However, if silicon or germanium is the carrier substance of the source, the open diffusion method according to the invention must not be performed in an oxidizing atmosphere; in this case, a protective gas such as nitrogen, argon or helium, or a reducing atmosphere, preferably hydrogen, is applicable.

We claim:

1. The method of doping semiconductor bodies by diffusing dopant from the gaseous phase into the bodies, which comprises placing the semiconductor bodies upon a perforated holder so as to cover respective openings of said holder, disposing two plate-shaped dopant sources on opposite sides of said holder in parallel relation to the semiconductor bodies, each of said sources being formed by a plate of carrier material and a surface region facing said bodies and containing doping substance in homogeneous distribution within the carrier material, and conjointly heating said bodies on the holder and said two sources in an open space and thereby vaporize a homogeneous layer of dopant from each of said sources onto one of the respective sides of said semiconductor bodies.

2. In the semiconductor doping method according to claim 1, said two surface regions of said respective sources having different compositions respectively.

3. In the semiconductor doping method according to claim 1, said two surface regions of said respective sources having different dopant concentrations respectively.

References Cited by the Examiner

UNITED STATES PATENTS

| | | | |
|---|---|---|---|
| 2,021,903 | 11/1935 | Tapie | 266—1 |
| 2,695,852 | 11/1954 | Spark | 148—189 |
| 2,729,190 | 1/1956 | Pawlyk | 117—97 X |
| 2,802,760 | 8/1957 | Derick | 148—189 |
| 2,827,403 | 3/1958 | Hall | 148—189 |
| 3,015,590 | 1/1962 | Fuller | 148—189 |
| 3,066,052 | 11/1962 | Howard. | |
| 3,145,447 | 8/1964 | Rumme. | |
| 3,178,798 | 4/1965 | Marinace | 148—189 X |
| 3,184,348 | 5/1965 | Marinace | 148—174 |
| 3,198,502 | 8/1965 | Thompson | 266—1 |
| 3,212,943 | 10/1965 | Freck | 148—189 |

HYLAND BIZOT, *Primary Examiner.*